(12) United States Patent
Janzen et al.

(10) Patent No.: US 9,466,344 B2
(45) Date of Patent: Oct. 11, 2016

(54) SYSTEM AND METHOD FOR DECODING COMMANDS BASED ON COMMAND SIGNALS AND OPERATING STATE

(75) Inventors: Jeffery W. Janzen, Meridian, ID (US); Brent Keeth, Boise, ID (US); Jeffrey P. Wright, Boise, ID (US); James S. Cullum, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 584 days.

(21) Appl. No.: 13/489,246

(22) Filed: Jun. 5, 2012

(65) Prior Publication Data

US 2012/0246434 A1  Sep. 27, 2012

Related U.S. Application Data

(60) Division of application No. 12/820,877, filed on Jun. 22, 2010, now Pat. No. 8,205,055, which is a continuation of application No. 11/121,868, filed on May 3, 2005, now Pat. No. 7,757,061.

(51) Int. Cl.
*G06F 12/10* (2016.01)
*G11C 7/10* (2006.01)
*G11C 11/4076* (2006.01)

(52) U.S. Cl.
CPC ......... *G11C 7/1072* (2013.01); *G11C 11/4076* (2013.01)

(58) Field of Classification Search
CPC .................. G11C 7/1072; G11C 11/4076
USPC .......................................... 711/156, 167, 208
See application file for complete search history.

(56) References Cited

U.S. PATENT DOCUMENTS

| | | |
|---|---|---|
| 4,507,761 A | 3/1985 | Graham |
| 5,463,590 A | 10/1995 | Watanabe |
| 5,721,860 A | 2/1998 | Stolt et al. |
| 5,748,551 A | 5/1998 | Ryan et al. |
| 5,749,086 A | 5/1998 | Ryan |
| 5,943,505 A | 8/1999 | Lumpkin et al. |
| 5,996,027 A | 11/1999 | Volk et al. |

(Continued)

FOREIGN PATENT DOCUMENTS

| | | |
|---|---|---|
| CN | 101375255 A | 2/2009 |
| JP | 58-166579 | 10/1983 |

(Continued)

OTHER PUBLICATIONS

Office Action in related EP Application No. 06 750 643.6-2210 mailed Oct. 18, 2011.

(Continued)

*Primary Examiner* — Jae Yu
(74) *Attorney, Agent, or Firm* — Dorsey & Whitney LLP

(57) ABSTRACT

A system and method for decoding command signals that includes a command decoder configured to generate internal control signals to perform an operation based on the command signals and an operating state. The same combination of command signals can request different commands depending on the operating state. A command is selected from a first set of operations according to the command signals when the memory system is in a first operating state and a command is selected from a second set of operations according to the command signals when the memory system is in a second operating state.

19 Claims, 8 Drawing Sheets

(56) References Cited

U.S. PATENT DOCUMENTS

| | | |
|---|---|---|
| 6,088,724 A | 7/2000 | Hasegawa |
| 6,233,192 B1 | 5/2001 | Tanaka |
| 6,233,195 B1 | 5/2001 | Yamazaki et al. |
| 6,286,069 B1 | 9/2001 | Chang |
| 6,438,062 B1 | 8/2002 | Curtis et al. |
| 6,560,161 B1 | 5/2003 | Zitlaw et al. |
| 6,629,224 B1 | 9/2003 | Suzuki et al. |
| 6,704,243 B2 | 3/2004 | Kho et al. |
| 6,826,680 B2 | 11/2004 | Muller |
| 7,757,061 B2 | 7/2010 | Janzen et al. |
| 2002/0024882 A1 | 2/2002 | Ikeda |
| 2002/0194448 A1* | 12/2002 | Yu ............................. 711/173 |
| 2003/0007405 A1 | 1/2003 | Kyung |
| 2003/0217223 A1 | 11/2003 | Nino, Jr. et al. |
| 2004/0047194 A1 | 3/2004 | MacInnis |
| 2004/0093461 A1 | 5/2004 | Kim |
| 2006/0265556 A1 | 11/2006 | Janzen et al. |
| 2010/0257332 A1 | 10/2010 | Janzen et al. |

FOREIGN PATENT DOCUMENTS

| | | |
|---|---|---|
| JP | 09-161475 | 6/1997 |
| WO | WO-2006/118788 A2 | 11/2006 |

OTHER PUBLICATIONS

"International Search Report and Written Opinion for International Application No. PCT/US2006/014650 mailed Jul. 24, 2008".

Office Action dated Oct. 19, 2010 for JP Application No. 2008-510019.

Office Action in related EP Application No. 06 750 643.6-2210, mailed Oct. 18, 2011.

Office Action mailed May 24, 2011 for JP Application No. 2008-510019.

EP Examination Report for Appl No. 06750643.6 dated Sep. 16, 2013.

* cited by examiner

| Function | command | | |
|---|---|---|---|
| | RAS# | CAS# | WE# |
| Load Mode | L | L | L |
| Refresh | L | L | H |
| Precharge | L | H | L |
| Bank Activate | L | H | H |
| Write | H | L | L |
| Read | H | L | H |
| Reserved | H | H | L |
| No Operation | H | H | H |

*Fig. 2*
(Background Art)

| Function | command RAS# | WE# | A10 | |
|---|---|---|---|---|
| Refresh per bank | L | L | L | Bank is closed |
| Refresh all banks | L | L | H | |
| Bank Activate | L | H | valid | |
| illegal/reserved | H | L | X | |
| Load Mode | H | H | valid | |
|  |  |  |  | |
| Single Bank Precharge | L | L | L | Bank is open |
| All Bank Precharge | L | L | H | |
| illegal/reserved | L | H | X | |
| Write | H | L | L | |
| Write with Auto Precharge | H | L | H | |
| Read | H | H | L | |
| Read with Auto Precharge | H | H | H | |

Fig. 6

SYSTEM AND METHOD FOR DECODING COMMANDS BASED ON COMMAND SIGNALS AND OPERATING STATE

CROSS-REFERENCE TO RELATED APPLICATION(S)

This application is a divisional of U.S. patent application Ser. No. 12/820,877, filed Jun. 22, 2010, and issued as U.S. Pat. No. 8,205,055, which is a continuation of U.S. patent application Ser. No. 11/121,868, filed May 3, 2005, and issued as U.S. Pat. No. 7,757,061. These applications and patents are incorporated herein by reference, in their entirety, for any purpose.

TECHNICAL FIELD

The invention relates generally to command decoding for a memory system, and more particularly, to decoding command signals to perform operations in the memory system based on the command signals and a operating state of the memory system.

BACKGROUND OF THE INVENTION

Computer systems use memory devices, such as synchronous dynamic random access memory ("SDRAM") devices, to store instructions and data that are access by a processor. These memory devices are normally used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data is transferred between the system memory and the processor.

FIG. 1 is a functional block diagram of a conventional memory device 100. The memory device 100 in FIG. 1 is an example of a double-data rate (DDR) SDRAM. The memory device 100 is referred to as a double-data-rate device because the data words DQ being transferred to and from the device are transferred at double the rate of a conventional SDRAM, which transfers data at a rate corresponding to the frequency of the applied clock signal. The memory device 100 includes a control logic and command decoder 134 that receives a plurality of command and clock signals over a control bus CONT, typically from an external circuit such as a memory controller (not shown). The command signals include a chip select signal CS#, a write enable signal WE#, a column address strobe signal CAS#, and a row address strobe signal RAS#, while the clock signals include a clock enable signal CKE# and complementary clock signals CLK, CLK#, with the "#" designating a signal as being active LOW. The command signals RAS#, CAS#, and WE# are driven to values corresponding to a particular command, such as a read, write, or auto-refresh command.

In response to the clock signals CLK, CLK#, the command decoder 134 latches and decodes an applied command, and generates a sequence of internal clock and control signals that control the components 102-132 to execute the function of the applied command. The clock enable signal CKE enables clocking of the command decoder 134 by the clock signals CLK, CLK#. The command decoder 134 further includes mode registers 136. Data written to the mode registers 136 are used to set various modes of operation, for example, burst data length, burst type, power-down mode, CAS latency, and the like. The command decoder 134 will generate the appropriate internal clock and control signals based on the modes set by the data stored in the mode registers 136.

The memory device 100 further includes an address register 102 that receives row, column, and bank addresses over an address bus ADDR, with a memory controller (not shown) typically supplying the addresses. The address register 102 receives a row address and a bank address that are applied to a row address multiplexer 104 and bank control logic circuit 106, respectively. The row address multiplexer 104 applies either the row address received from the address register 102 or a refresh row address from a refresh counter 108 to a plurality of row address latch and decoders 110A-D. The bank control logic 106 activates the row address latch and decoder 110A-D corresponding to either the bank address received from the address register 102 or a refresh bank address from the refresh counter 108, and the activated row address latch and decoder latches and decodes the received row address.

In response to the decoded row address, the activated row address latch and decoder 110A-D applies various signals to a corresponding memory bank 112A-D to thereby activate a row of memory cells corresponding to the decoded row address. Each memory bank 112A-D includes a memory-cell array having a plurality of memory cells arranged in rows and columns, and the data stored in the memory cells in the activated row is stored in sense amplifiers in the corresponding memory bank. The row address multiplexer 104 applies the refresh row address from the refresh counter 108 to the decoders 110A-D and the bank control logic circuit 106 uses the refresh bank address from the refresh counter when the memory device 100 operates in an auto-refresh or self-refresh mode of operation in response to an auto- or self-refresh command being applied to the memory device 100, as will be appreciated by those skilled in the art.

A column address is applied on the ADDR bus after the row and bank addresses, and the address register 102 applies the column address to a column address counter and latch 114 which, in turn, latches the column address and applies the latched column address to a plurality of column decoders 116A-D. The bank control logic 106 activates the column decoder 116A-D corresponding to the received bank address, and the activated column decoder decodes the applied column address. Depending on the operating mode of the memory device 100, the column address counter and latch 114 either directly applies the latched column address to the decoders 116A-D, or applies a sequence of column addresses to the decoders starting at the column address provided by the address register 102. In response to the column address from the counter and latch 114, the activated column decoder 116A-D applies decode and control signals to an I/O gating and data masking circuit 118 which, in turn, accesses memory cells corresponding to the decoded column address in the activated row of memory cells in the memory bank 112A-D being accessed.

During data read operations, data being read from the addressed memory cells is coupled through the I/O gating and data masking circuit 118 to a read latch 120. The I/O gating and data masking circuit 118 supplies N bits of data to the read latch 120, which then applies two N/4 bit words to a multiplexer 122. In the embodiment of FIG. 3, the circuit 118 provides 32 bits to the read latch 120 which, in turn, provides four 8 bits words to the multiplexer 122. A data driver 124 sequentially receives the N/4 bit words from the multiplexer 122 and also receives a data strobe signal DQS from a strobe signal generator 126 and a delayed clock signal CLKDEL from the delay-locked loop 123. The DQS signal is used by an external circuit such as a memory controller (not shown) in latching data from the memory device 100 during read operations. In response to the delayed clock signal CLKDEL, the data driver 124 sequentially outputs the received N/4 bits words as a corresponding data word DQ, each data word being output in synchronism with a rising or falling edge of a CLK signal that is applied to clock the memory device 100. The data driver 124 also outputs the data strobe signal DQS having rising and falling edges in synchronism with rising and falling edges of the CLK signal, respectively. Each data word DQ and the data strobe signal DQS collectively define a data bus DATA. The DATA bus also includes masking signals DM0-M for masking write data of data write operations, as will be described in more detail below.

During data write operations, an external circuit such as a memory controller (not shown) applies N/4 bit data words DQ, the strobe signal DQS, and corresponding data masking signals DM on the data bus DATA. A data receiver 128 receives each DQ word and the associated DM signals, and applies these signals to input registers 130 that are clocked by the DQS signal. In response to a rising edge of the DQS signal, the input registers 130 latch a first N/4 bit DQ word and the associated DM signals, and in response to a falling edge of the DQS signal the input registers latch the second N/4 bit DQ word and associated DM signals. The input register 130 provides the two latched N/4 bit DQ words as an N-bit word to a write FIFO and driver 132, which clocks the applied DQ word and DM signals into the write FIFO and driver in response to the DQS signal. The DQ word is clocked out of the write FIFO and driver 132 in response to the CLK signal, and is applied to the I/O gating and masking circuit 118. The I/O gating and masking circuit 118 transfers the DQ word to the addressed memory cells in the accessed bank 112A-D subject to the DM signals, which may be used to selectively mask bits or groups of bits in the DQ words (i.e., in the write data) being written to the addressed memory cells.

As previously described, commands are issued to the memory device 100 in the form of command signals, which are decoded by the command decoder 134 to generate internal clock and control signals to perform the requested operation. FIG. 2 is a command decoding truth table for the memory device 100. The three command signals RAS#, CAS#, and WE# provide eight different commands for the memory device 100. These commands include LOAD MODE, REFRESH, PRECHARGE, BANK ACTIVATE, WRITE, READ, NOP (no operation), and a RESERVED command, which can be used in the future for an additional command. The LOAD MODE command is used to load data into the mode registers 136, which, as previously discussed, is used to set various modes of operation, for example, burst data length, burst type, power-down mode, CAS latency, and the like. The REFRESH command is used to invoke a refresh sequence in the memory banks 112A-D. The PRECHARGE command is used to deactivate or "close" activated, or "open," memory banks 112A-D. The BANK ACTIVATE command is used to open at least one of the memory banks 112A-D, as selected by a bank address, in preparation for an memory access operation. The WRITE command and the READ command are used to invoke a data write operation and a data read operation, respectively, as previously described. The NOP operation is used to prevent unwanted commands from being registered during idle or wait states of the memory device 100.

The use of the RAS#, CAS#, and WE# signals provides an effective way to issue commands to the memory device 100. However, there are limitations that are inherent with this conventional approach. One such limitation is the maximum number of different possible commands that are provided with the conventional command decoding of the memory device 100. As illustrated above, due to the binary nature of the RAS#, CAS#, and WE# signals, the three command signals provide a maximum decoding of eight different commands. Although eight different commands are sufficient for current technology, it is easy to imagine that in the future there may be the need for more than the eight commands previously described. If additional commands are desired, additional command signals will need to be used. For example, if two additional commands for a total of ten commands are desired, one command could be decoded using the RESERVED command. However, the other additional command would require adding one more signal to the existing three commands signals. With four command signals, there are now potentially sixteen different commands that can be decoded.

Although having additional choices for commands appears to be advantageous, it raises another limitation of the conventional command decoding employed by the memory device 100. That is, increasing the number of command signals to increase the number of different commands that can be decoded, will increase the number of external terminals or "pins" of the memory device 100 that are required to receive the command signals. In the present example, three external terminals are used by the memory device 100 for receiving the RAS#, CAS#, and WE# signals. Having more than the eight possible commands requires at least four external terminals to provide sufficient command decoding. The number can increase to twice that number in light of the development of systems employing differential command signals where each command signal is applied to the memory device as a pair of complementary signals requiring two external terminals.

Currently, the number of external terminals that can be included with a conventionally packaged memory device is reaching its physical limits. The physical dimensions of the memory device package can always be increased to accommodate additional external terminals, however, this solution conflicts with the desirability of creating portable and compact electronic systems. Additionally, adding external terminals increases the number of signal lines that must be used to communicate between a memory controller and the memory device. As applied to memory modules, the additional external terminals of each memory device will require additional conductive traces to be formed on the different layers of the printed circuit board ("PCB"), thus, increasing the complexity of the PCB in design and manufacture. As a result, increasing the number of external terminals in response to the need to accommodate additional command choices is highly undesirable.

Therefore, there is a need for an alternative system and method for command decoding that can be used to provide greater flexibility in increasing the number of commands and/or reducing the number of command signals used in decoding commands.

SUMMARY OF THE INVENTION

Embodiments of the present invention are directed to a system and method for decoding command signals. In one aspect, a command decoder is configured to generate internal control signals to perform an operation selected from a first set of operations according to the latched logic levels of the command signals when the memory system is in a first operating state. The command decoder is further configured to generate internal control signals to perform an operation selected from a second set of operations according to the latched logic levels of the command signals when the memory system is in a second operating state. In another aspect, a method of decoding command signals includes receiving command signals, and selecting one operation from a first set of operations in accordance with the command signals while the memory system is in a first operating state, and selecting one operation from a second set of operations in accordance with the command signals while the memory system is in a second operating state.

BRIEF DESCRIPTION OF THE DRAWINGS

FIG. 2 is a truth table of conventional command decoding utilized in the memory system of FIG. 1.

FIG. 6 is a truth table of command decoding that can be utilized in the memory system of FIG. 3 according to an alternative embodiment of the present invention.

DETAILED DESCRIPTION OF PREFERRED EMBODIMENTS

Embodiments of the present invention provide systems and methods for command decoding in a memory that decodes commands based on command signals in combination with an operating state of the memory. Certain details are set forth below to provide a sufficient understanding of the invention. However, it will be clear to one skilled in the art that the invention may be practiced without these particular details. In other instances, well-known circuits, control signals, timing protocols, and software operations have not been shown in detail in order to avoid unnecessarily obscuring the invention.

Figure 1:
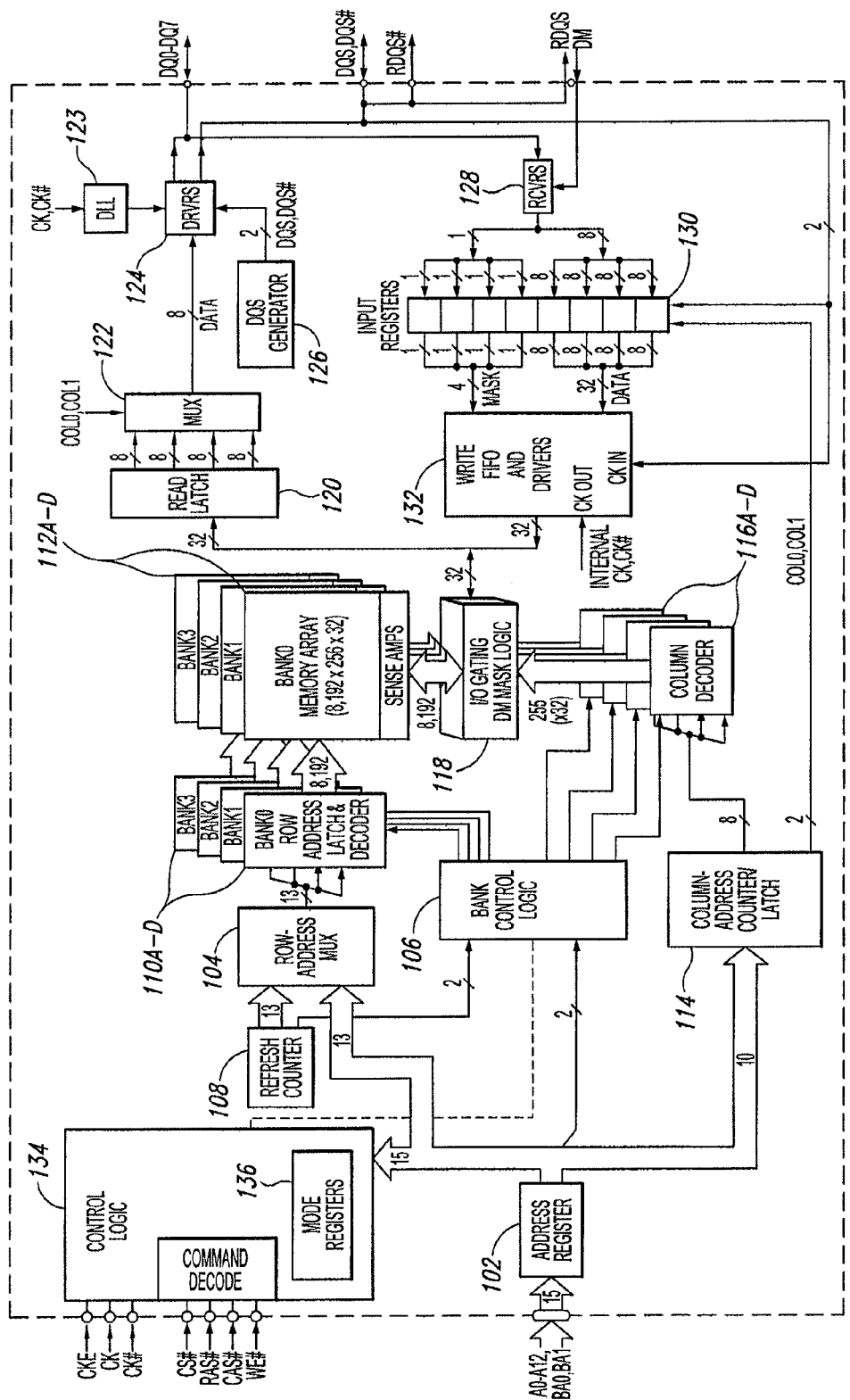
FIG. 1 is a functional block diagram of a memory system having conventional command decoding.
Figure 3:
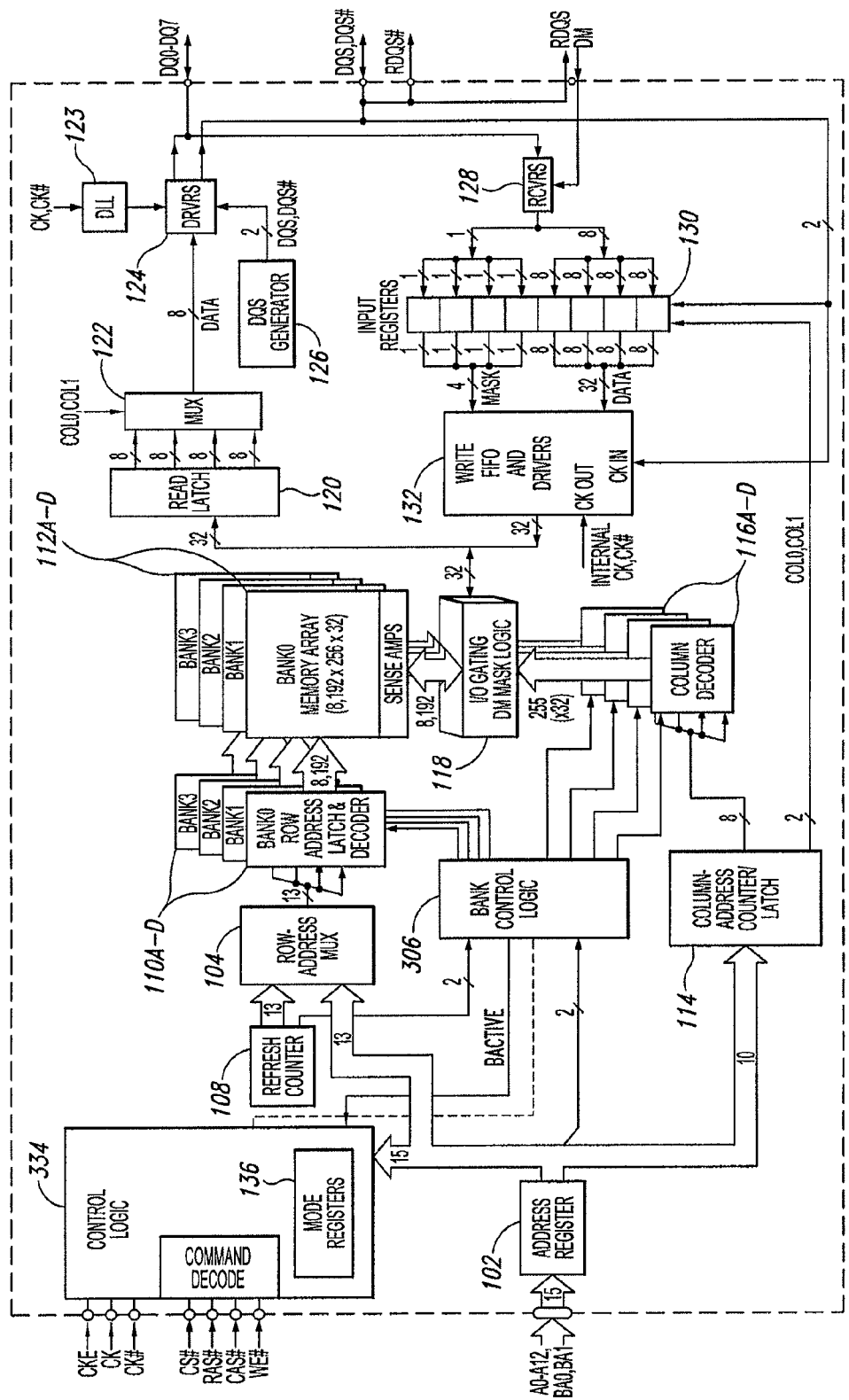
FIG. 3 is a functional block diagram of a memory system having command decoding according to an embodiment of the present invention.

FIG. 3 illustrates a memory device 300 having control logic and command decoder 334 according to an embodiment of the present invention. Many of the circuits included in the memory device 300 have been previously described with respect to the memory device 100 of FIG. 1, and consequently, in the interest of brevity, will not be described again. Operation of these circuits in the memory device 300 are the same as in previously described with respect to the memory device 100 of FIG. 1, and are referenced in FIG. 3 using the same reference number. The command decoder 334, however, is different than the command decoder 134 of the memory device 100. The command decoder 334 decodes command signals applied to the memory device 300 and generates internal clock and control signals to execute the requested command based on the command signals in combination with a operating state of the memory device 300. Thus, unlike the command decoder 134 of the memory device 100, the command decoder 334 generates the internal signals to perform a requested operation based on the set of command signals applied to the memory device 300 and its current operating state. As a result, the number of command signals needed for decoding the commands can be reduced while maintaining the same number of different commands available. Alternatively, the number of different commands can be increased without increasing the number of command signals.

For example, the memory device 300 has the same number of commands as previously described for the memory device 100, and shown in the table of FIG. 2. Namely, the eight different commands are LOAD MODE REGISTERS, REFRESH, PRECHARGE, BANK ACTIVATE, WRITE, READ, RESERVED, and NOP. These eight commands for the memory device 100 can be selected based on the combination of the logic states of the three command signals RAS#, CAS#, and WE#. In contrast, and as will be described in more detail below, the memory device 300 can select one of the same eight commands using only two command signals, RAS# and WE#, in combination with monitoring a bank active state. In this particular embodiment, the command decoder 334 is coupled to the bank control logic 306 to receive a bank active state signal BACTIVE having a logic state indicative of whether any of the memory banks 112A-D are "open" (i.e., active) or if all of the banks are "closed" (i.e., precharged).

Figure 4:
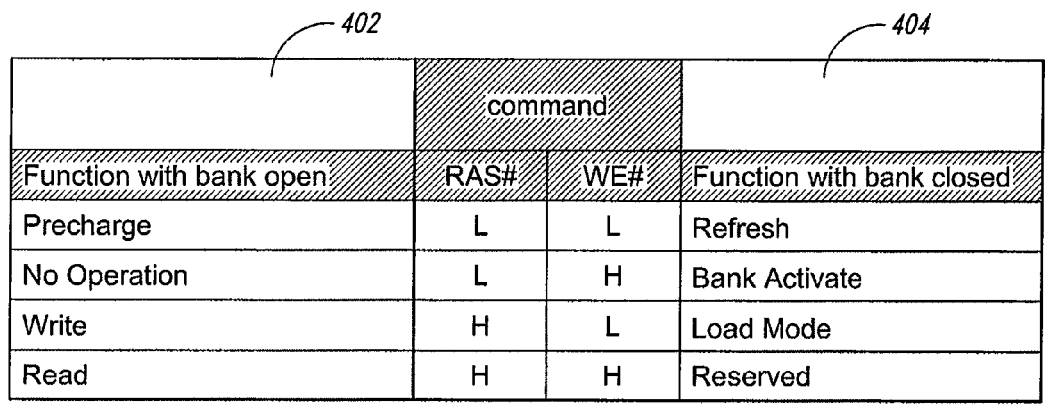
FIG. 4 is a truth table of the command decoding utilized in the memory system of FIG. 3 according to an embodiment of the present invention.

FIG. 4 illustrates a truth table for command decoding in the memory device 300 of FIG. 3 according to an embodiment of the present invention. Column 402 lists the commands for different combinations of the RAS# and WE# signals when any of the memory banks 312A-D are open. Column 404 lists the commands for different combinations of the RAS# and WE# signals for when all of the memory banks 312A-D are closed. For example, in the event the command decoder 334 receives a HIGH RAS# signal and a LOW WE# signal at the time the BACTIVE signal is active, indicating that at least one of the memory banks 312A-D is open, the command decoder 334 will generate internal clock and control signals to execute a WRITE operation to at least one memory location in the memory banks 312A-D identified by the address and bank signals, as previously described. However, if the HIGH RAS# signal and LOW WE# signal are applied to the memory device 300 at a time the BACTIVE signal is inactive, indicating that all of the memory banks 312A-D are closed, the command decoder 334 will generate internal clock and control signals to execute a LOAD MODE command that loads mode information into the mode register 136, as previously described. As shown by comparing the truth table of FIG. 4 with the truth table of FIG. 2, the memory device 300 has the same eight commands as the memory device 100, but only requires the two RAS# and WE# signals instead of the three RAS#, CAS#, and WE# signals.

Figure 5:
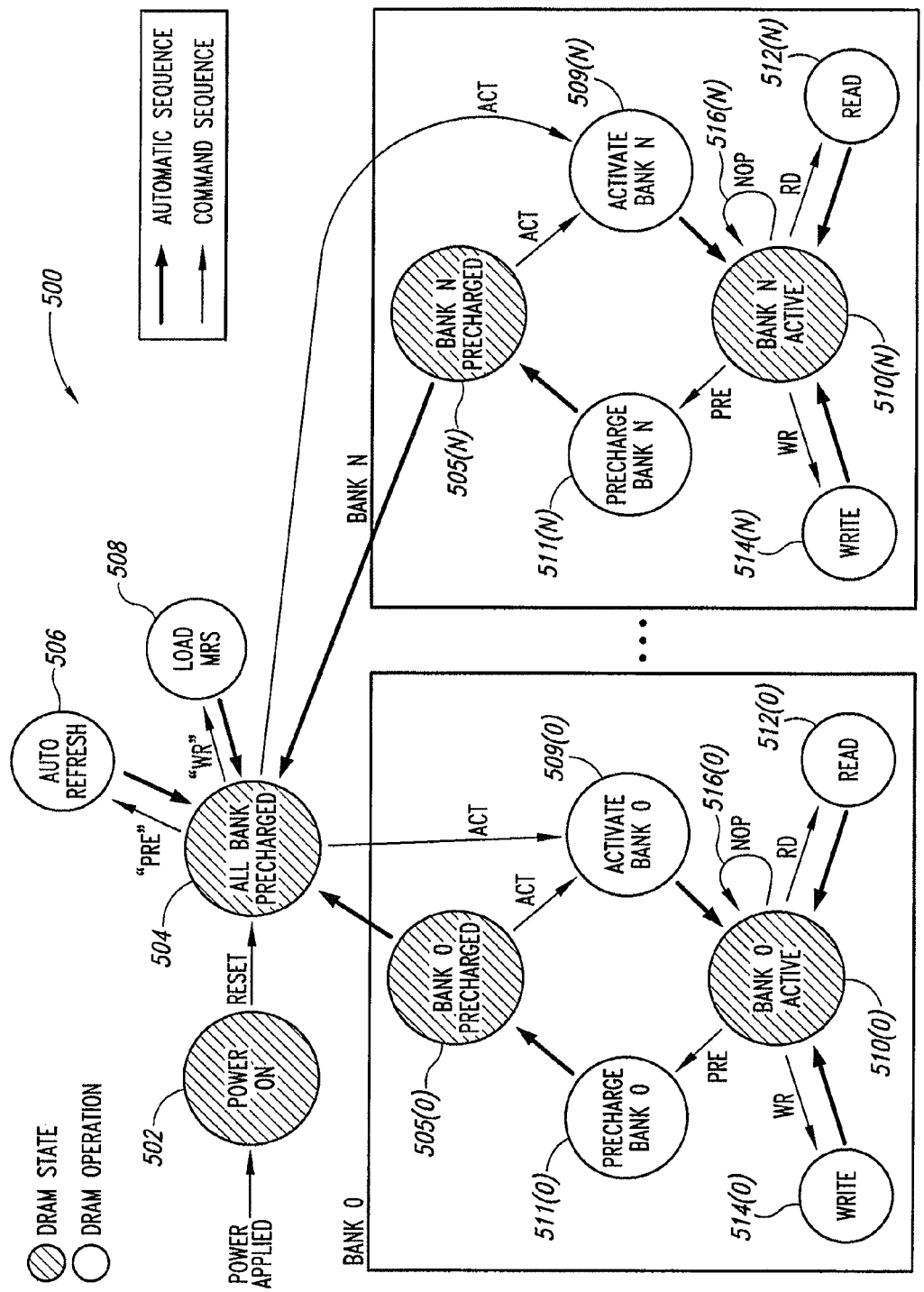
FIG. 5 is a state diagram for the command decoding shown in the truth table of FIG. 4.

FIG. 5 is a state diagram illustrating the command decoding of the memory device 300 as previously described with respect to the command decoding truth table of FIG. 4. FIG. 5 illustrates various memory device operations, represented by circles, and various memory device states, represented by shaded circles. The memory device 300 changes states and performs operations in response to command signals RAS# and WE#, with command sequences (defined by a combination of command signals) and changes of state represented by arrows pointing from a memory device state to a memory device operation. Bold arrows in FIG. 5 represent an automatic sequence that returns the memory device 300 to a memory device state upon completion of the memory device operation. As will be explained in more detail below, FIG. 5 illustrates command decoding on a per bank basis for memory banks 0 to N, which correspond to the memory banks 112A-D of the memory device 300. Memory bank selection is made by way of bank addresses applied to the memory device at the time the command signals are latched.

Upon application of power to the memory device 300, a power-on sequence is executed to place the memory device 300 in a POWER ON state 502. When the power-on sequence is complete, the memory device 300 exits the POWER ON state 502 and is reset to an ALL BANK PRECHARGED state 504. While in the ALL BANK PRECHARGED state 504 and all of the memory banks 112A-D are closed, application of the RAS# and WE# signals are be decoded by the command decoder 334 into one of three commands (not including the RESERVED command). The three commands shown in FIG. 5 are a REFRESH command that causes the memory device 300 to execute an AUTO REFRESH operation 506, a LOAD MODE command that causes the memory device 300 to execute an LOAD MRS operation 508, or a BANK ACTIVATE command that causes the memory device 300 to execute an ACTIVATE BANK command 509 for a particular memory bank 0 through N.

The REFRESH command is decoded from a LOW RAS# signal and a LOW WE# signal applied to the command decoder 334 while the memory device 300 is in the ALL BANK PRECHARGED state 504. In response, the memory device 300 changes from the ALL BANK PRECHARGED state 504 to execute the AUTO REFRESH sequence 506. When the AUTO REFRESH sequence 506 is completed, the memory device 300 returns to the ALL BANK PRECHARGED state 504, as shown by the bold arrow pointing from the AUTO REFRESH state 506 back to the ALL BANK PRECHARGED state 504, to await further commands. Similarly, the LOAD MODE command is decoded from a HIGH RAS# signal and a LOW WE# signal while the memory device 300 is in the ALL BANK PRECHARGED state 504. The LOAD MODE command is shown in FIG. 5 as "WR" representing the combination of a HIGH RAS# signal and LOW WE# signal, which would be decoded to a WRITE command if the memory device was in the BANK ACTIVE state 510. In response to the LOAD MODE command, the state of the memory device 300 changes from the ALL BANK PRECHARGED state 504 to execute the LOAD MRS operation 508, whereupon completion, the memory device 300 returns to the ALL BANK PRECHARGED state 504.

The third command that can be decoded when the memory device 300 is in the BANK CLOSED state 504 is the BANK ACTIVATE command, decoded from a LOW RAS# signal and a HIGH WE# signal. The BANK ACTIVATE command is shown in FIG. 5 as "ACT" representing the combination of a LOW RAS# signal and a HIGH WE# signal. As previously described, a BANK ACTIVATE command is a per bank command that activates at least one of the memory banks 312A-D, typically identified by bank address signals. The BANK ACTIVATE command causes the memory device 300 to change from the ALL BANK PRECHARGED state 504 to execute an ACTIVATE BANK operation 509 for the particular memory bank. Upon completion of the ACTIVATE BANK operation 509, the state of the memory device 300 for the particular memory bank changes to a BANK ACTIVE state 510. The activated memory bank 312A-D remains activated until a PRECHARGE command is decoded by the memory device 300, whereupon the state of the memory device 300 changes to from the BANK ACTIVE state 510 to execute a PRECHARGE BANK operation 511. Upon completing the PRECHARGE BANK operation 511, the memory device 300 returns through a BANK PRECHARGE state 505 to the ALL BANK PRECHARGED state 504. A BANK ACTIVATE command decoded while the memory device 300 is in the BANK PRECHARGE state 505 will execute the ACTIVATE BANK operation 509 and change the state of the memory device 300 to the BANK ACTIVE state 510. Two other commands that can be decoded in addition to the PRECHARGE command from the RAS# and WE# signals while the memory device 300 is in the BANK ACTIVE state 510 are a READ command that causes the memory device 300 to execute a READ operation 512 and a WRITE command that causes the memory device 300 to execute a WRITE operation 514. A no operation NOP command can also be decoded by the command decoder 334 from the RAS# and WE# signals while the memory device 300 is in the BANK ACTIVE state 510, but as well known, typically does not cause the memory device to perform an operation. As shown in FIG. 5, when a NOP command is decoded during the BANK ACTIVE state 510 the memory device does not change states. When the READ and WRITE commands are decoded, a respective command is executed and upon completion, the memory device 300 returns to the BANK ACTIVE state 510.

As illustrated by the state diagram 500, the same specific combination of the RAS# and WE# signals can be decoded by the command decoder 334 to execute different sets of commands depending on the particular operating state of the memory device 300. For example, the combination of a LOW RAS# signal and a LOW WE# signal is labeled in the state diagram 500 as "PRE." In one case where the memory device is in the ALL BANK PRECHARGED state 504, the PRE combination of the RAS# and WE# signals results in the memory device 300 changing from the ALL BANK PRECHARGED state 504 to execute the AUTO REFRESH operation 506 to perform an auto-refresh sequence. However, if the PRE combination of RAS# and WE# signals is applied when the memory device 300 is in the BANK ACTIVE state 510, it causes the memory device 300 to change from the BANK ACTIVE state 510 to the BANK PRECHARGED state 505 by executing the PRECHARGE BANK operation 511. Thus, using just the one PRE combination of RAS# and WE# signals, two different commands can be decoded.

FIG. 6 illustrates a command decoding truth table 600 for the memory device 300 according to an alternative embodiment of the present invention. The command decoding truth 600 illustrates the use of an input signal that is not typically used as a command signal to provide additional command decoding choices. In the embodiment that will be described with reference to FIG. 6, the address signal A10 is used, in combination with the RAS# and WE# command signals shown in column 602, and further in combination with the memory bank open/closed states shown in column 604, to select a particular refresh or precharge mechanism shown in column 606. Conventional memory devices have utilized a signal typically not used for commands, such as the A10 signal, to select different refresh and precharge mechanisms. However, conventional devices do not utilize command decoding as previously described according to an embodiment of the present invention. Thus, the combination of the command decoding of embodiments of the present invention with the use of a signal not typically used for commands, such as the A10 signal, provides additional alternative embodiments of the present invention.

Operation of the command decoding shown in the truth table 600 will now be described with respect to the memory device 300. When the memory device 300 is in a BANK CLOSED state, and a LOW RAS# signal and a LOW WE# signal are applied to the memory decoder 334, a refresh command is decoded. The logic level of the A10 signal is used to select whether the refresh sequence is executed on a per memory bank basis, or all memory banks 312A-D are refreshed concurrently. As shown in columns 606 and 608, a LOW A10 signal selects a per memory bank refresh operation and a HIGH A10 signal selects an all memory bank refresh operation. As further shown in column 608, the A10 signal is interpreted as part of a valid value when a BANK ACTIVATE command or a LOAD MODE command is issued while the memory device 300 is in the BANK CLOSED state.

As previously described, the A10 signal is used to select a refresh sequence when a refresh command is issued during the BANK CLOSED state. Additionally, the A10 signal is used to select various precharge sequences when a precharge command is issued during a BANK OPEN state. As shown in column 608, the A10 signal is used in combination with the RAS# and WE# signals to select single or all bank precharge, auto-precharge following a write command, and auto-precharge following a read command. The A10 signal can be used to select whether an auto-precharge sequence is executed following a write or read command since the A10 signal is not used to select a particular memory location for access.

Figure 7:
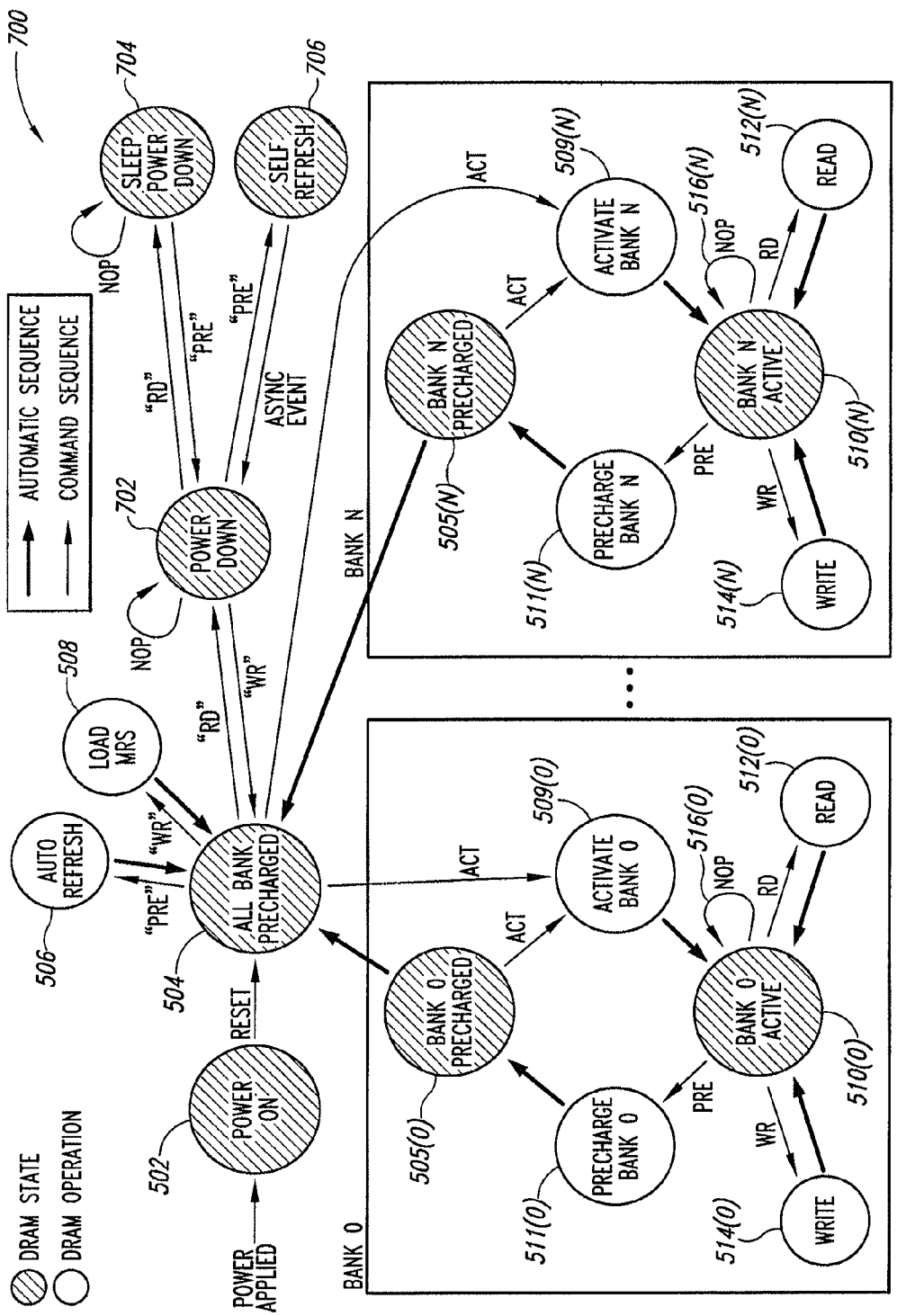
FIG. 7 is a state diagram for command decoding that can be utilized in the memory system of FIG. 3 according to an alternative embodiment of the present invention.

FIG. 7 illustrates a state diagram 700 for command decoding by the memory device 300 according to another embodiment of the present invention. The state diagram 700 of FIG. 7 is similar to the state diagram 500 of FIG. 5 and uses the same convention as previously described with respect to the memory device state, memory device operation, command sequence and automatic sequences. Also as with the state diagram 500 of FIG. 5, the command decoding can be on a per memory bank basis for memory banks 0 through N. The particular memory bank is selected by the bank address signals provided to the memory device 300 at the time the command signals RAS# and WE# are latched. In comparison to the state diagram 500 of FIG. 5, additional commands and operating states are defined in the state diagram 700 without increasing the number of command signals. All of the commands and states shown in the state diagram 700 of FIG. 7 can be decoded based on the RAS# and WE# signals, in combination with the particular operating state of the memory device 300.

An additional state shown in the state diagram 700 is a POWER DOWN state 702. The POWER down state 702 represents a condition where the memory device 300 is placed into a low-power state during which many of the circuits are deactivated, such as the output drivers 124 (FIG. 3), the input receivers 128, and the DLL 123 in order to reduce power consumption. The POWER DOWN state 702 can be reached by applying a HIGH RAS# signal and a HIGH WE# signal from the ALL BANK PRECHARGED state 504. In contrast to the command decoding illustrated in the truth table 400 of FIG. 4, the state diagram 700 utilizes the RESERVED command to change to the POWER DOWN state 702. The RESERVED command is shown in FIG. 7 as "RD" representing the combination of a HIGH RAS# signal and a HIGH WE# signal, which is the combination of the command signals for a READ command in a BANK ACTIVE state 510. From the POWER DOWN state 702, the state of the memory device 300 can be changed to a SLEEP POWER DOWN state 704 or a SELF REFRESH state 706 depending on the RAS# and WE# signals applied. Where a HIGH RAS# signal and a HIGH WE# signal are applied to the command decoder 334 when the memory device 300 is in the POWER DOWN state 702, the operating state changes to the SLEEP POWER DOWN state 704. The SLEEP POWER DOWN state 704 represents a condition where the memory device 300 is placed into a low-power state to a greater extent than in the POWER DOWN state 702. For example, the SLEEP POWER DOWN state 704 may not require a CLK signal to be applied, and consequently, clock buffers of the memory device 300 can be deactivated in addition to the input and output circuits. To return from the SLEEP POWER DOWN state 704 to the POWER DOWN state 702, a LOW RAS# signal and a LOW WE# signal are applied to the command decoder 334. For the memory device 300 to change from the POWER DOWN state 702 to the SELF REFRESH state 706, a LOW RAS# signal and a LOW WE# signal are applied to the command decoder 334. During the SELF REFRESH STATE 706, the memory device 300 executes a self-refresh sequence to refresh memory cells of the memory banks 312A-D. Upon completion of the self-refresh sequence, the state of the memory device 300 returns to the POWER DOWN state 702.

As illustrated in FIG. 7, for a particular combination of the RAS# and WE# signals, an even greater number of commands can be decoded by applying the specific combination of RAS# and CAS# signals during different operating states of the memory device 300. For example, taking the combination of a LOW RAS# signal and a LOW WE# signal, labeled in the state diagram 700 as "PRE," four different commands can be decoded from the same PRE combination. The first command, which results from the application of the PRE combination of RAS# and WE# signals during the ALL BANK PRECHARGED state 504, causes the memory device 300 to change from the ALL BANK PRECHARGED state 504 to execute the AUTO REFRESH operation 506. The second command, which results from application of the PRE combination of the RAS# and WE# signals during the BANK ACTIVE state 510, causes the memory device 300 to execute the PRECHARGE BANK command 511 to change to the BANK PRECHARGED state 505. The third command, which results from application of the PRE combination of the RAS# and WE# signals during the POWER DOWN state 702, causes the memory device 300 to change to the SELF REFRESH state 706 to execute a self-refresh sequence. The fourth command, which results from the application of the PRE combination of the RAS# and WE# signals during the SLEEP POWER DOWN state 704 causes the memory device 300 to exit the SLEEP POWER DOWN state 704 to the POWER DOWN state 702. Thus, four different commands can be decoded using only one combination of the two RAS# and WE# command signals, in combination with the memory state of the memory device 300.

Figure 8:
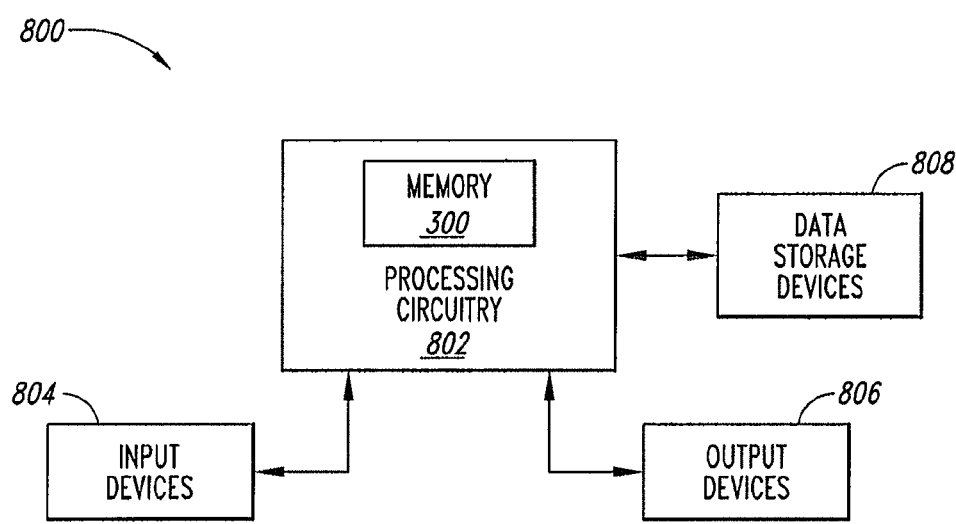
FIG. 8 is a functional block diagram of a processing system including a memory system having command decoding according to an embodiment of the present invention.

FIG. 8 is a block diagram of a processing system 800 including processing circuitry 802 including the memory device 300 having a command decoder 334 that utilizes command decoding according to an embodiment of the present invention. Typically, the processing circuitry 802 is coupled through address, data, and control buses to the memory device 300 to provide for writing data to and reading data from the memory device. The processing circuitry 802 includes circuitry for performing various processing functions, such as executing specific software to perform specific calculations or tasks. In addition, the processing system 800 includes one or more input devices 804, such as a keyboard or a mouse, coupled to the processing circuitry 802 to allow an operator to interface with the processing system 800. Typically, the processing system 800 also includes one or more output devices 806 coupled to the processing circuitry 802, such as output devices typically including a printer and a video terminal. One or more data storage devices 808 are also typically coupled to the processing circuitry 802 to store data or retrieve data from external storage media (not shown). Examples of typical storage devices 808 include hard and floppy disks, tape cassettes, compact disk read-only (CD-ROMs) and compact disk read-write (CD-RW) memories, and digital video disks (DVDs).

From the foregoing it will be appreciated that, although specific embodiments of the invention have been described herein for purposes of illustration, various modifications may be made without deviating from the spirit and scope of the invention. For example, the embodiments of the invention described herein have been described with respect to monitoring the open or closed state of the banks of memory 112A-D as an example of an operating state that is monitored for decoding the command signals. However, other embodiments of the invention monitor alternative operating states in decoding the command signals, including the different operating states previously described, such as a power down state and refresh states. Accordingly, the invention is not limited except as by the appended claims.

What is claimed is:

1. An apparatus, comprising:
a latch configured to receive and latch a command; and
a command decoder coupled to the latch and configured to receive the command and receive a bank signal indicative of a state of a bank, the command decoder configured to perform a first operation responsive, at least in part, to a first command and the bank signal indicating the bank is in a first state and further configured to perform a second operation responsive, at least in part, to the first command and the bank signal indicating the bank is in a second state, the command decoder further configured to perform a third operation responsive, at least in part, to a second command and the bank signal indicating the bank is in the first state.

2. The apparatus of claim 1, further comprising:
bank control logic configured to provide the bank signal to the command decoder; and
wherein the first state corresponds to a first operating state of the bank and the second state corresponds to a second operating state of the bank.

3. The apparatus of claim 1, wherein the first operation is one of plurality of bank active operations and the second operation is one of plurality of bank inactive operations.

4. The apparatus of claim 3, wherein at least one of the plurality of bank active operations is configured to switch the bank to switch to a third state.

5. The apparatus of claim 1, wherein the command comprises at least one of a row address select signal, a write enable signal, or an A10 signal.

6. The apparatus of claim 1, wherein the apparatus is included in a memory.

7. A method of decoding command signals applied to a memory bank, comprising:
monitoring an operating state of the memory bank, the memory bank having a precharged operating state and an active operating state;
performing an operation from a first set of operations in accordance with a first combination of the command signals responsive, at least in part, to the memory bank is operating in the precharged operating state; and
performing an operation from a second set of operations in accordance with second combination of the command signals responsive, at least in part, to the memory bank is operating in the active second operating state.

8. The method of claim 7, further comprising:
performing an operation from a third set of operations in accordance with the command signals while the memory bank is in a third operating state.

9. The method of claim 8, further comprising:
monitoring a logic level of a signal applied to the memory bank.

10. The method of claim 9, wherein said monitoring a logic level of a signal applied to the memory bank comprises:
monitoring the logic state of an address signal.

11. The method of claim 8, wherein said performing an operation from the first set of operations in accordance with the command signals comprises:
performing an operation that results in the memory bank changing from the precharged operating state to the third operating state.

12. The method of claim 11, wherein the thud operating state comprises a power down state.

13. The method of claim 7, wherein said performing an operation from a first set of operations in accordance with the command signals while the memory bank is in the precharged operating state comprises:
performing a first mode of an operation in response to the signal having a first logic level and performing a second mode of the operation in response to the signal having the second logic level.

14. The method of claim 7, wherein said monitoring an operating state of the memory bank comprises:
receiving a bank state signal; and
determining the operating state of the memory bank based, at least in part, on the bank state signal.

15. A method, comprising:
receiving a command;
receiving a bank state signal indicative of a state of a memory bank;
performing a first operation based, at least in part, on a first command and the bank state signal indicating the bank has a first state;
performing as second operation based, at least in part, on the first command and the bank state signal indicating the bank has a second state; and
performing a third operation based least in part, on a second command and the bank state signal indicating the bank has the first state.

16. The method of claim 15, further comprising:
performing a third operation based, at least in part, on the bank state signal indicating the memory bank has a third state.

17. The method of claim 14, wherein said performing the first operation based, at least in part, on the bank state signal indicating the memory bank has a first state comprises:
performing an operation that causes the memory bank to change from the first state to a third state.

18. The method of claim 14, wherein the first state corresponds to an active state and the second state corresponds to an inactive state.

19. The method of claim 14, wherein said performing the first operation based, at least in part, on the bank state signal indicating the bank has a first state comprises:
   generating a set of internal signals to perform the first operation.

* * * * *

UNITED STATES PATENT AND TRADEMARK OFFICE
CERTIFICATE OF CORRECTION

PATENT NO.        : 9,466,344 B2
APPLICATION NO.   : 13/489246
DATED             : October 11, 2016
INVENTOR(S)       : Jeffery W. Janzen et al.

Page 1 of 1

It is certified that error appears in the above-identified patent and that said Letters Patent is hereby corrected as shown below:

In the Claims

| | Reads | Should Read |
|---|---|---|
| Column 12, Line 9 | "in accordance with second combination" | --in accordance with a second combination-- |
| Column 12, Line 11 | "operating in the active second operating" | --operating in the active operating-- |
| Column 12, Line 30 | "wherein the thud operating" | --wherein the third operating-- |
| Column 12, Line 53 | "performing as second operation" | --performing a second operation-- |
| Column 12, Line 56 | "operation based least in part," | --operation based, at least in part,-- |

Signed and Sealed this
Twenty-fifth Day of April, 2017

Michelle K. Lee
*Director of the United States Patent and Trademark Office*